United States Patent
Chu et al.

(10) Patent No.: US 9,847,754 B2
(45) Date of Patent: Dec. 19, 2017

(54) MULTI-MIXER SYSTEM AND ASSOCIATED RECEIVER AND SIGNAL PROCESSING METHOD

(71) Applicant: MEDIATEK INC., Hsin-Chu (TW)

(72) Inventors: Kun-Da Chu, Hsinchu County (TW); Chi-Yao Yu, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/180,068

(22) Filed: Jun. 12, 2016

(65) Prior Publication Data

US 2017/0019068 A1    Jan. 19, 2017

Related U.S. Application Data

(60) Provisional application No. 62/191,608, filed on Jul. 13, 2015.

(51) Int. Cl.
| | | |
|---|---|---|
| H04B 1/18 | (2006.01) | |
| H03D 7/16 | (2006.01) | |
| H04B 1/00 | (2006.01) | |
| H04B 1/10 | (2006.01) | |
| H03H 7/01 | (2006.01) | |
| H03H 7/06 | (2006.01) | |

(52) U.S. Cl.
CPC ............ *H03D 7/16* (2013.01); *H03H 7/0153* (2013.01); *H03H 7/06* (2013.01); *H03H 7/17* (2013.01); *H04B 1/005* (2013.01); *H04B 1/1036* (2013.01)

(58) Field of Classification Search
CPC .......... H04B 1/10; H04B 1/005; H04B 1/006; H04L 27/2334
USPC ......... 455/189.2, 209, 293, 296, 307, 552.1, 455/323, 326
See application file for complete search history.

(56) References Cited

U.S. PATENT DOCUMENTS

| 5,010,400 A * | 4/1991 | Oto ........................ H03J 5/242 348/731 |
| 8,923,777 B2 * | 12/2014 | Nezhad-Ahmadi .... H04B 1/006 370/278 |
| 2005/0159129 A1 * | 7/2005 | Iida .................... H04B 1/71635 455/326 |
| 2006/0176215 A1 | 8/2006 | Dubash et al. |
| 2015/0177296 A1 * | 6/2015 | Crooks ................. G01R 19/02 702/198 |

FOREIGN PATENT DOCUMENTS

| EP | 1 843 468 A1 | 10/2007 |
| EP | 2 581 751 A2 | 4/2013 |
| WO | WO 2010/051387 A2 | 5/2010 |

OTHER PUBLICATIONS

Extended European Search Report for Application No. 16174898.3 dated Nov. 23, 2016.

* cited by examiner

*Primary Examiner* — Sonny Trinh
(74) *Attorney, Agent, or Firm* — Wolf, Greenfield & Sacks, P.C.

(57) ABSTRACT

A multi-mixer system comprising a plurality of mixers and a filter module is provided. Each of the mixers is selectively enabled to mix an input signal with a corresponding oscillation signal to generate an output signal at an output node; and the filter module provides different frequency responses for the output signals from at least two of the output nodes of the mixers, wherein the at least two of the output nodes of the mixers are connected to different internal nodes of the filter module.

20 Claims, 8 Drawing Sheets

MULTI-MIXER SYSTEM AND ASSOCIATED RECEIVER AND SIGNAL PROCESSING METHOD

CROSS REFERENCE TO RELATED APPLICATIONS

This application claims the priority of U.S. Provisional Application No. 62/191,608, filed on Jul. 13, 2015, which is included herein by reference in its entirety.

BACKGROUND

A receiver may be required to support multi-standards such as GGE (Global System for Mobile Communications (GSM)/General Packet Radio Service (GPRS)/Enhanced Data rates for GSM Evolution (EDGE)), Wideband Code Division Multiple Access (WCDMA), Long Term Evolution (LTE), etc. The standards, however, may have different signal bandwidth and/or require different out-of-band blocker tolerant capability. Therefore, how to provide a programmable frequency conversion interface to support all standards is an important topic.

SUMMARY

It is therefore an objective of the present invention to provide a multi-mixer system, which develops a special connection between mixers and filters to provide frequency conversions for all standards.

According to one embodiment of the present invention, a multi-mixer system comprising a plurality of mixers and a filter module is provided. Each of the mixers is selectively enabled to mix an input signal with a corresponding oscillation signal to generate an output signal at an output node; and the filter module provides different frequency responses for the output signals from at least two of the output nodes of the mixers, wherein the at least two of the output nodes of the mixers are connected to different internal nodes of the filter module.

According to another embodiment of the present invention, a receiver comprising a plurality of mixers and a filter module is provided. Each of the mixers is selectively enabled to mix an input signal with a corresponding oscillation signal to generate an output signal at an output node; and the filter module provides different frequency responses for the output signals from at least two of the output nodes of the mixers, wherein the at least two of the output nodes of the mixers are connected to different internal nodes of the filter module.

According to another embodiment of the present invention, a signal processing method of a multi-mixer system comprises: mixing a first input signal with a first oscillation signal to generate a first output signal; forwarding the first output signal to an internal node of a filter module to make the filter module provide a first frequency responses for the first output signal; mixing a second input signal with a second oscillation signal to generate a second output signal; and forwarding the second output signal to another internal node of the filter module to make the filter module provide a second frequency responses for the second output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
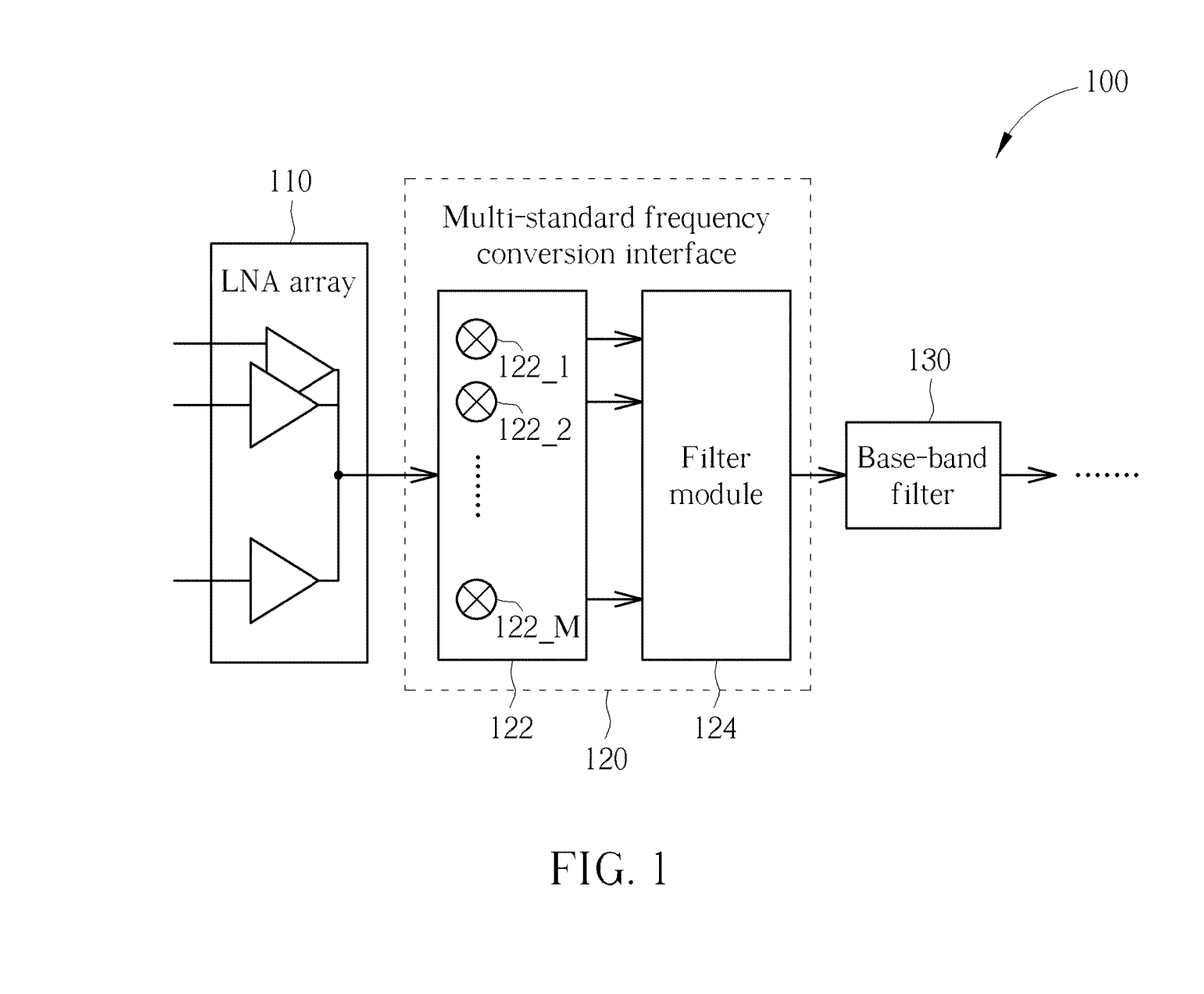
FIG. 1 is a diagram illustrating a receiver according to one embodiment of the present invention.

Please refer to FIG. 1, which is a diagram illustrating a receiver 100 according to one embodiment of the present invention. As shown in FIG. 1, the receiver 100 comprises at least a low-noise amplifier (LNA) array 110, a multi-standard frequency conversion interface 120 and a base-band filter 130, where the multi-standard frequency conversion interface 120 comprises a plurality of mixers 122_1-122_M and a filter module 124, and the mixers 122_1-122_M may use different oscillation signals (different frequencies) to mix the input signals, respectively. In this embodiment, the receiver 100 further comprises a plurality of radio frequency (RF) input ports for receiving input signals with different standards, where the different standards may be GGE, WCDMA, LTE, . . . etc..

In the operations of the receiver 100, the LNA array 110 is used to amplify the input signal from the RF input port. Then, based on the standard of the input signal, one or more of the mixers 122_1-122_M is enabled to mix the input signal (s) with corresponding oscillation signal (s) to generate an output signal (base-band signal). Then, the output signal is filtered by the filter module 124 and the base-band filter 130, and the filtered output signal is forwarded into a baseband processor.

Figure 2:
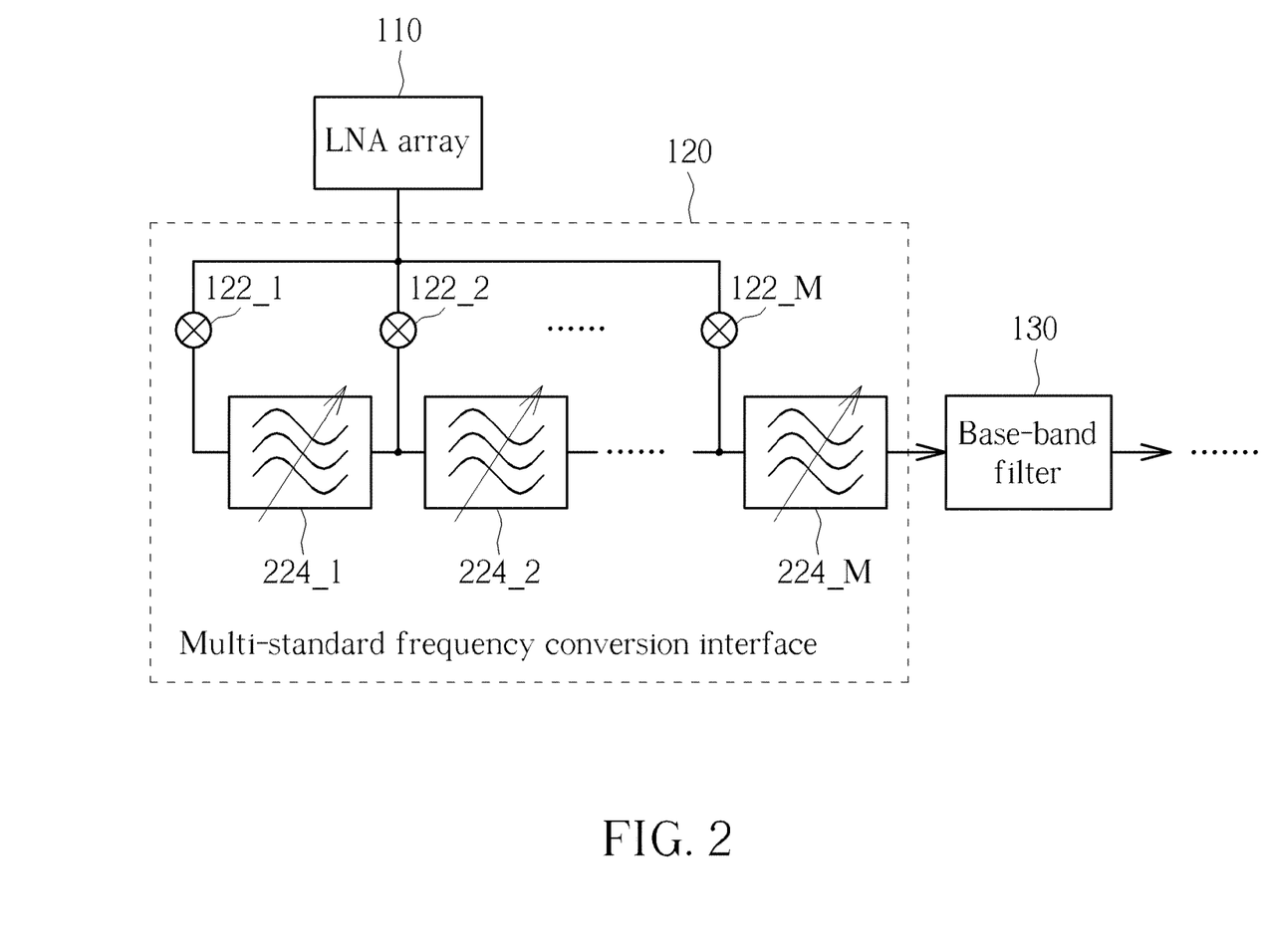
FIG. 2 is a diagram illustrating the multi-standard frequency conversion interface shown in FIG. 1 according to one embodiment of the present invention.

In this embodiment, at least two of the output nodes of the mixers 122_1-122_M are connected to different internal nodes of the filter module 124, so as to make the filter module 124 provide different frequency responses for the output signals from the at least two of the output nodes of the mixers 122_1-122_M. For example, referring to FIG. 2, the filter module 124 is an N-order filter module comprising a plurality of filters 224_1-224_M (tunable filters) connected in cascade, and the mixers 122_1-122_M are connected to input nodes of the filters 224_1-224_M, respectively. In the embodiment shown in FIG. 2, each of the filters 224_1-224_M may be implemented by a low-pass filter, a band-pass filter, or a high-pass filter, or the combination.

Figure 3:
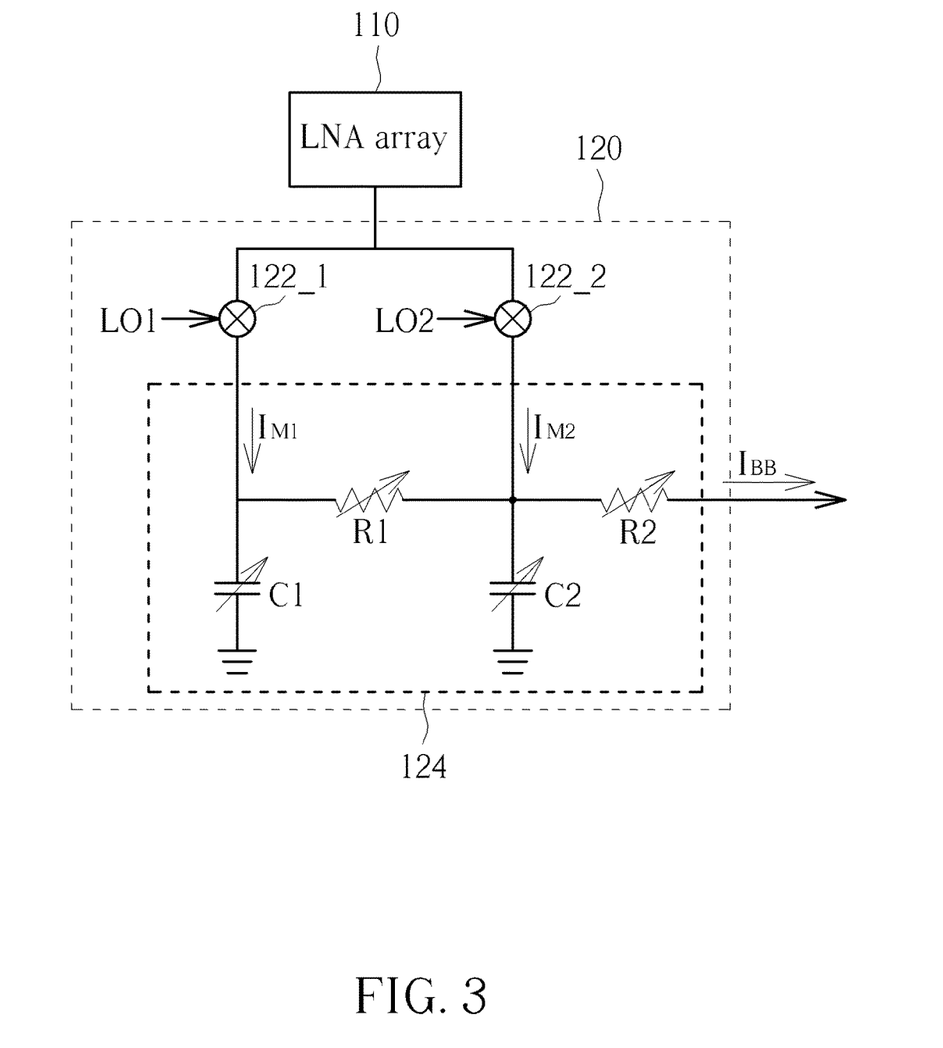
FIG. 3 is a diagram illustrating an embodiment of the multi-standard frequency conversion interface according to one embodiment of the present invention.

FIG. 3 is a diagram illustrating an embodiment of the multi-standard frequency conversion interface 120 according to one embodiment of the present invention. As shown in FIG. 3, the filter module 124 is arranged to receive a current input to generate a current output, and the filter module 124 comprises two low-pass filters connected in cascade, where the first low-pass filter comprises a variable resistor R1 and a capacitor C1, and the second low-pass filter comprises a variable resistor R2 and a capacitor C2. In FIG. 3, it is assumed that the receiver 100 supports a GGE mode and a LTE mode, and when the receiver 100 operates in the GGE mode, the mixer 122_2 is disabled, and the mixer 122_1 is enabled to mix the input signal with an oscillation signal LO1 to generate an output signal $I_{M1}$, and the filter module 124 filters the output signal $I_{M1}$ to generate a filtered output signal $I_{BB}$; and when the receiver 100 operates in the LTE mode, the mixer 122_1 is disabled, and the mixer 122_2 is enabled to mix the input signal with an oscillation signal LO2 to generate an output signal $I_{M2}$, and the filter module 124 filters the output signal $I_{M2}$ to generate a filtered output signal $I_{BB}$.

In this embodiment, when the receiver 100 operates in the GGE mode, if R2C2<<(R1+R2)*C1, the transfer function of the filter module 124 for the output signal IM1 is as follows:

$$\frac{I_{BB}}{I_{M1}} \approx \frac{1}{1+s(R1+R2)*C1};$$

and when the receiver 100 operates in the GGE mode, if R2<<R1, the transfer function of the filter module 124 for the output signal IM2 is as follows:

$$\frac{I_{BB}}{I_{M2}} \approx \frac{1}{1+sR2C2}.$$

Figure 4:
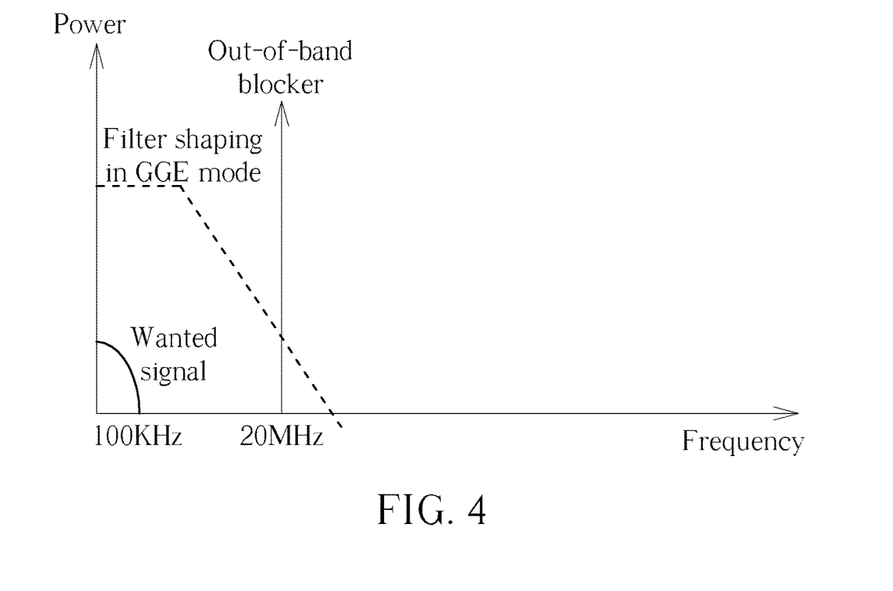
FIG. 4 shows the filter setting of the GGE mode according to one embodiment of the present invention.
Figure 5:
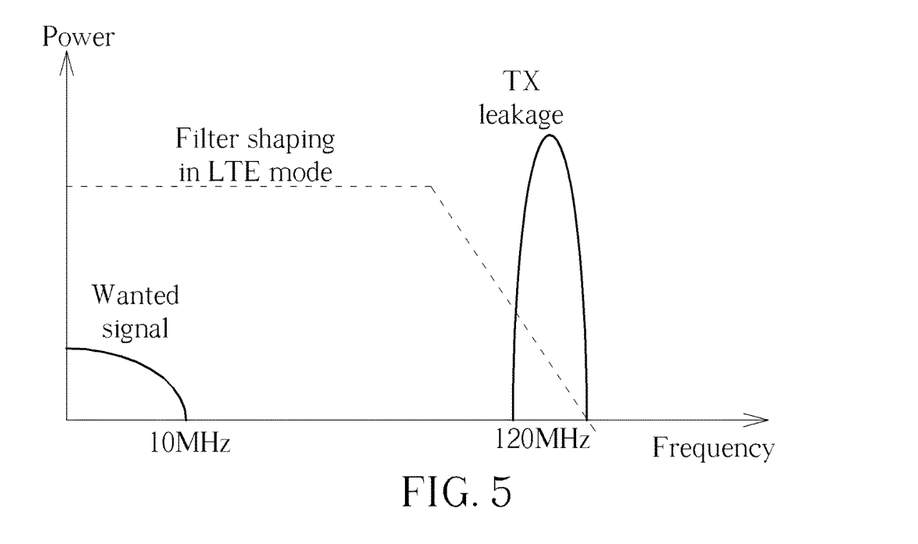
FIG. 5 shows the filter setting of the LTE mode according to one embodiment of the present invention.

FIG. 4 and FIG. 5 show the filter setting of the GGE mode and the LTE mode according to one embodiment of the present invention. In FIG. 4, because the in-band signal is similar to 100 kHz and the out-of-band blocker is 20 MHz in the GGE specification, the resistors R1 and R2 and the capacitors C1 and C2 can be controlled to make the 3-dB corner frequency of the filter module 124 to be any appropriate value such as 3.32 MHz. In FIG. 5, because the in-band signal is similar to 10 MHz and the TX leakage is similar to 120 MHz in the LTE specification, the resistors R1 and R2 and the capacitors C1 and C2 can be controlled to make the 3-dB corner frequency of the filter module 124 to be any appropriate value such as 44.21 MHz. Therefore, by simply adjusting the resistors R1 and R2 and the capacitors C1 and C2, the filter module 124 can have appropriate filter shaping for different standards/specifications.

In addition, in the embodiments mentioned above, the frequency response of the filter module 124 is changed in accordance with the change of the selected mixer. That is, the filter module 124 does not need to have capacitor switches therein to select the required filters for the selected mixer. Therefore, the chip area of the filter module 124 can be reduced, and the design of the filter module 124 can be simplified.

Figure 6:
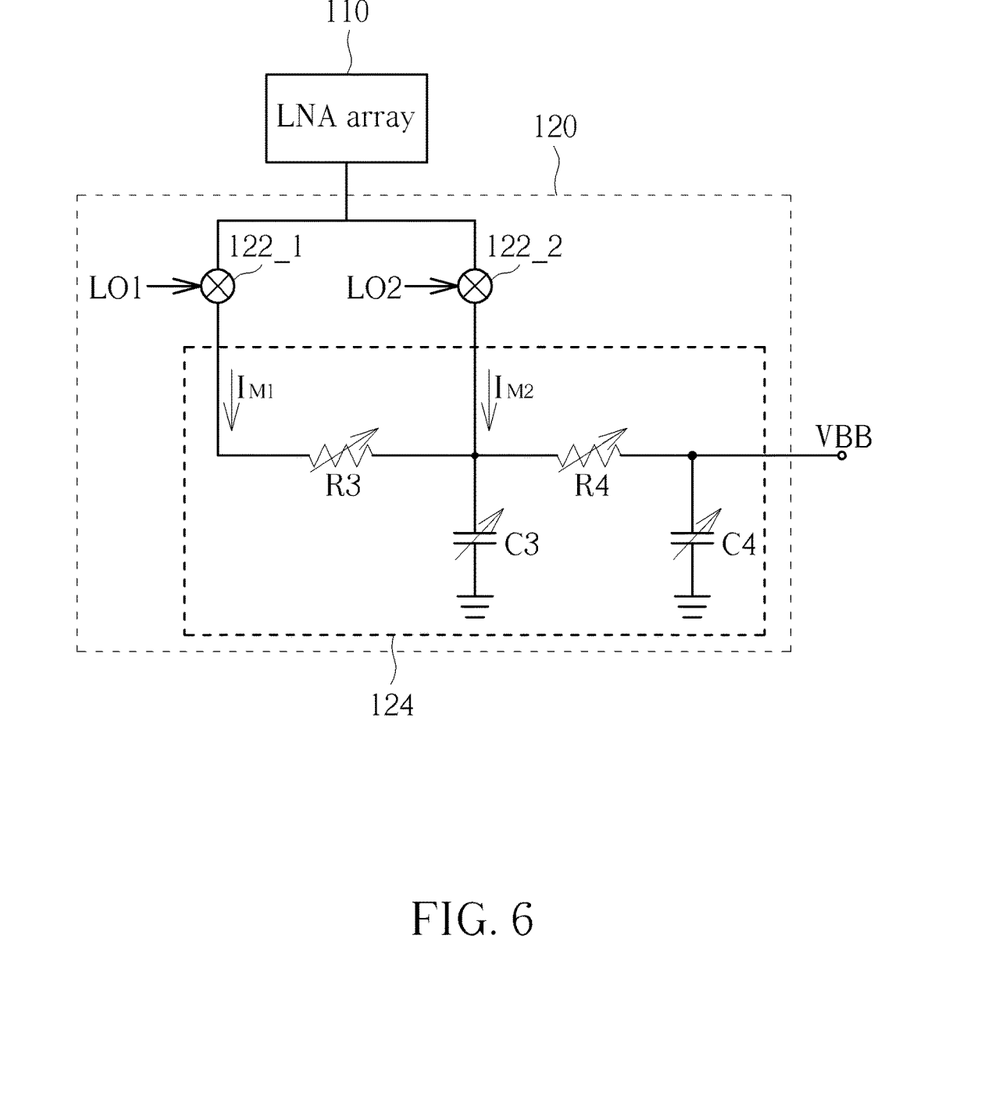
FIG. 6 is a diagram illustrating an embodiment of the multi-standard frequency conversion interface according to another embodiment of the present invention.

FIG. 6 is a diagram illustrating an embodiment of the multi-standard frequency conversion interface 120 according to another embodiment of the present invention. As shown in FIG. 6, the filter module 124 is arranged to receive a current input to generate a voltage output, and the filter module 124 comprises two low-pass filters connected in cascade, where the first low-pass filter comprises a variable resistor R3 and a capacitor C3, and the second low-pass filter comprises a variable resistor R4 and a capacitor C4. In FIG. 6, when the receiver 100 operates in a first mode, the mixer 122_2 is disabled, and the mixer 122_1 is enabled to mix the input signal with an oscillation signal LO1 to generate an output signal $I_{M1}$, and the filter module 124 filters the output signal $I_{M1}$ to generate a filtered output signal VBB; and when the receiver 100 operates in a second mode, the mixer 122_1 is disabled, and the mixer 122_2 is enabled to mix the input signal with an oscillation signal LO2 to generate an output signal $I_{m2}$, and the filter module 124 filters the output signal $I_{m2}$ to generate a filtered output signal VBB. Similar to the embodiment shown in FIGS. 4-5, by simply controlling the resistors R3 and R4 and the capacitors C3 and C4, the filter module 124 can have appropriate filter shaping for the first mode and the second mode.

Figure 7:
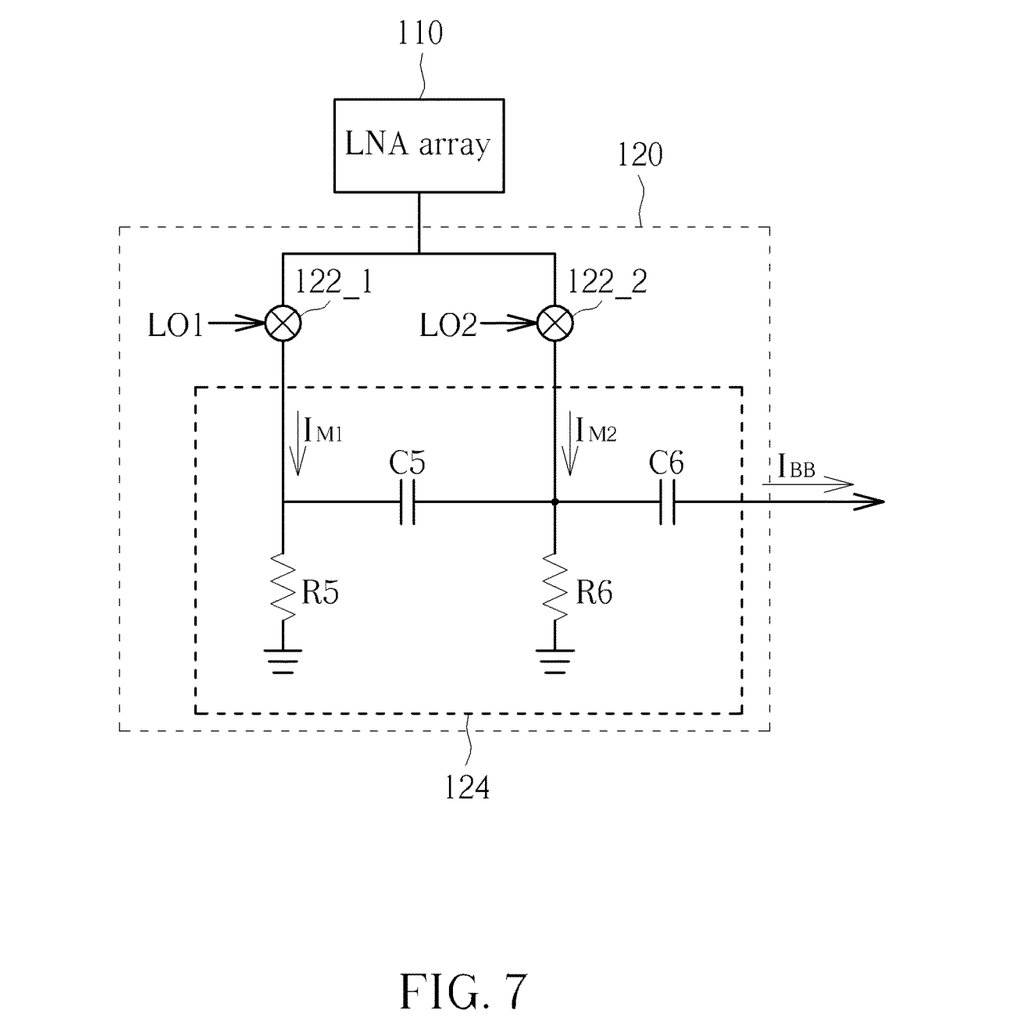
FIG. 7 is a diagram illustrating an embodiment of the multi-standard frequency conversion interface according to another embodiment of the present invention.

FIG. 7 is a diagram illustrating an embodiment of the multi-standard frequency conversion interface 120 according to another embodiment of the present invention. As shown in FIG. 7, the filter module 124 is arranged to receive a current input to generate a current output, and the filter module 124 comprises two high-pass filters connected in cascade, where the first high-pass filter comprises a variable resistor R5 and a capacitor C5, and the second high-pass filter comprises a variable resistor R6 and a capacitor C6. In FIG. 7, when the receiver 100 operates in a first mode, the mixer 122_2 is disabled, and the mixer 122_1 is enabled to mix the input signal with an oscillation signal LO1 to generate an output signal $I_{M1}$, and the filter module 124 filters the output signal $I_{M1}$ to generate a filtered output signal $I_{BB}$; and when the receiver 100 operates in a second mode, the mixer 122_1 is disabled, and the mixer 122_2 is enabled to mix the input signal with an oscillation signal LO2 to generate an output signal $I_{M2}$, and the filter module 124 filters the output signal $I_{M2}$ to generate a filtered output signal $I_{BB}$. Similar to the embodiment shown in FIGS. 4-5, by simply controlling the resistors R5 and R6 and the capacitors C5 and C6, the filter module 124 can have appropriate filter shaping for the first mode and the second mode.

Figure 8:
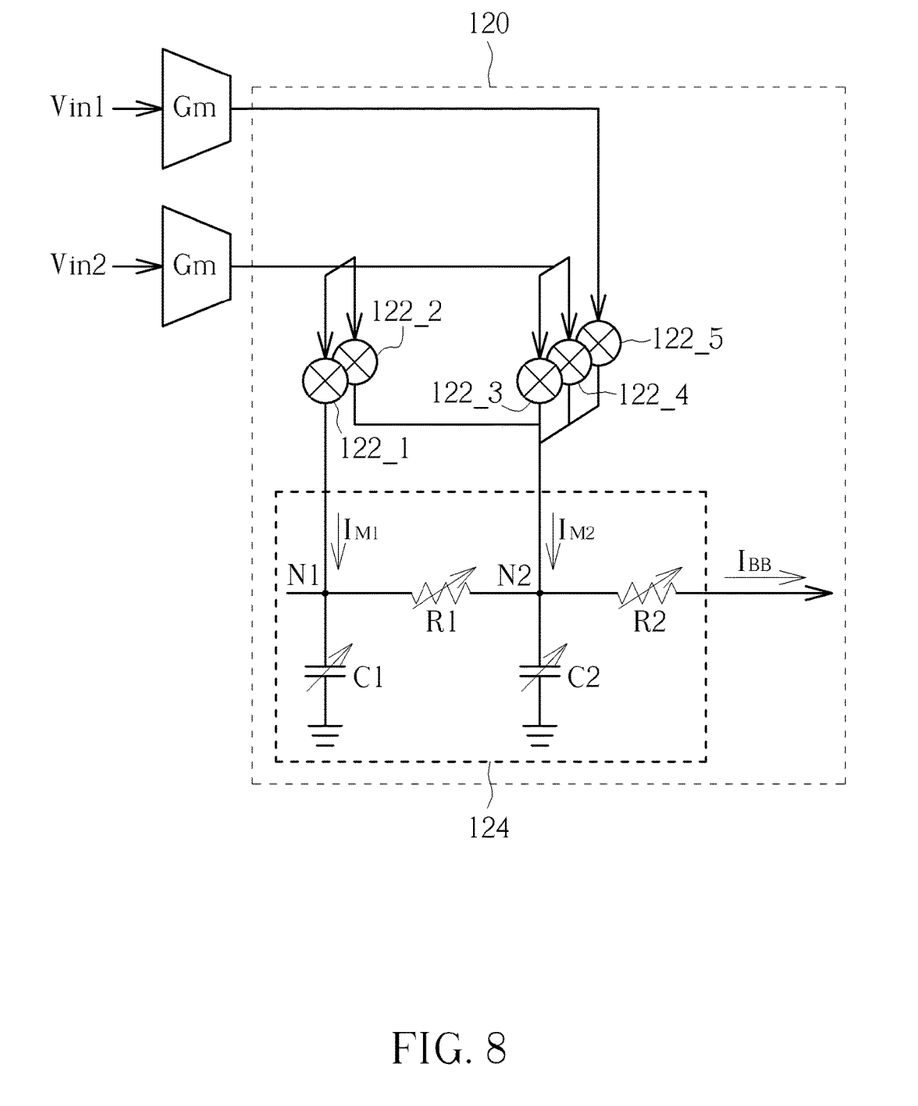
FIG. 8 is a diagram illustrating an embodiment of the multi-standard frequency conversion interface according to another embodiment of the present invention.

FIG. 8 is a diagram illustrating an embodiment of the multi-standard frequency conversion interface 120 according to another embodiment of the present invention. In FIG. 8, the LNA array 1100 is arranged to provide two input signals Vin1 and Vin2 at different ports, where the input signals Vin1 and Vin2 may belong to different standards; the mixers 122_1-122_4 are arranged to receive the input signal Vin1, and the mixer 122_5 is arranged to receive the input signal Vin2, where different oscillation signals are used for the mixers 122_1-122_5. In addition, the output node of the mixer 122_1 is connected to an internal node N1 of the filter module 124, and the output nodes of the mixers 122_2-

122_5 are all connected to an internal node N2 of the filter module 124. In this embodiment, by using two or more inputs with hybrid mixer connection, this system can support different standards or different bandwidths. For example, the mixers 122_1 and 122_2 can be used for different standards and different bandwidths shown in FIGS. 3-5; and the mixers 122_3-122_5 are used for different standards with the same/similar bandwidth.

Figure 9:
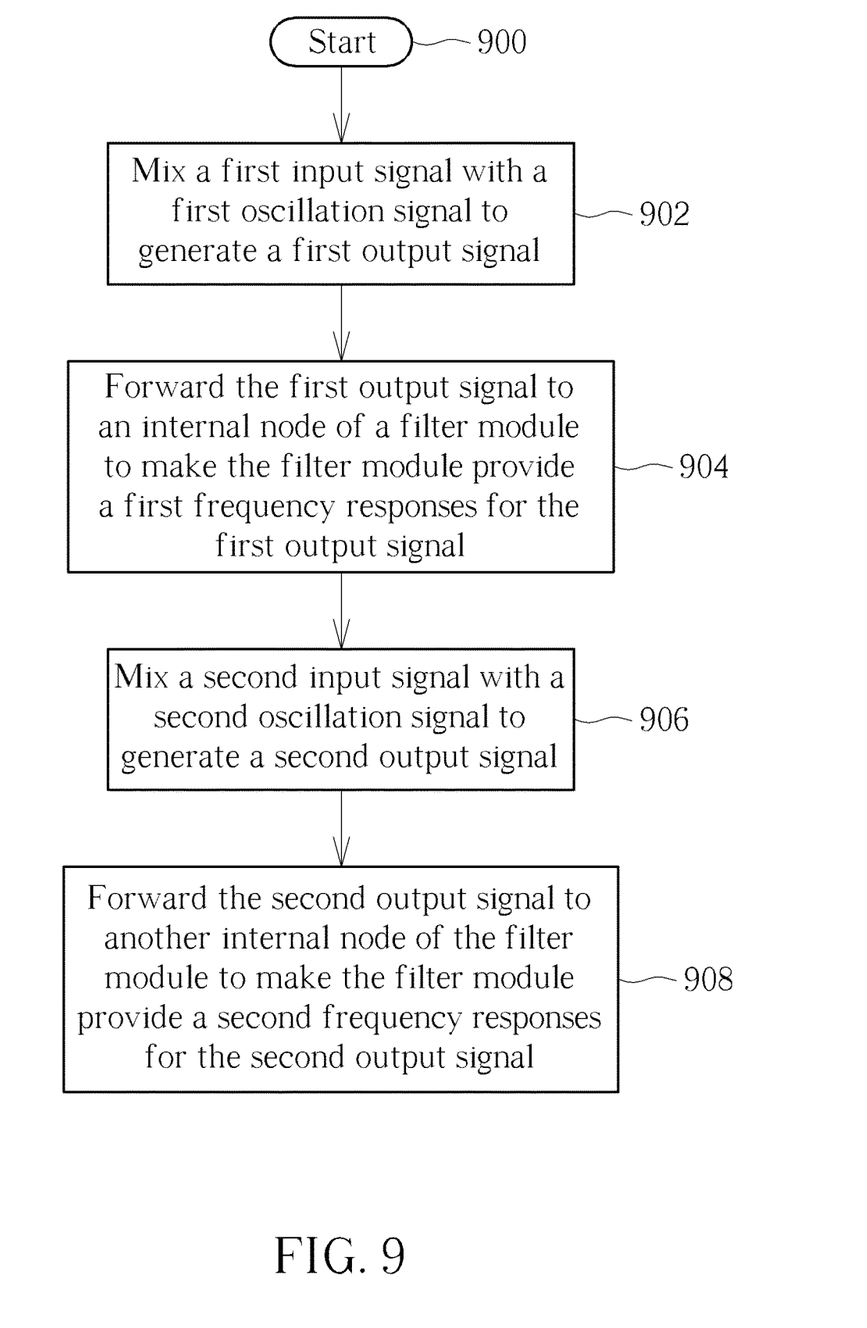
FIG. 9 is a flowchart of a signal processing method of a multi-mixer system according to one embodiment of the present invention.

FIG. 9 is a flowchart of a signal processing method of a multi-mixer system according to one embodiment of the present invention. Referring to FIGS. 1-9 together, the flow is described as follows.

Step 900: the flow starts.

Step 902: mix a first input signal with a first oscillation signal to generate a first output signal.

Step 904: forward the first output signal to an internal node of a filter module to make the filter module provide a first frequency responses for the first output signal.

Step 906: mix a second input signal with a second oscillation signal to generate a second output signal.

Step 908: forward the second output signal to another internal node of the filter module to make the filter module provide a second frequency responses for the second output signal.

Briefly summarized, in the receiver of the present invention, the output nodes of a portion of the mixers are connected to different internal nodes of a filter module, so as to make the filter module provide different frequency responses. Furthermore, the transfer function of the filter module can be controlled by simply changing the resistance/capacitance of the internal elements. Therefore, design of the filter module can be simplified, and the chip area of the filter module is reduced due to the common circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-mixer system, comprising:
a plurality of mixers including a first mixer and a second mixer, wherein the first mixer is enabled based on a first characteristic of a first input signal to the multi-mixer system and the second mixer is enabled based on a second characteristic of a second input signal to the multi-mixer system, wherein the plurality of mixers mix the first and second input signals with a corresponding oscillation signal to generate output signals at output nodes of the plurality of mixers; and
a filter module, for providing different frequency responses for the output signals from at least two of the output nodes of the plurality of mixers, wherein the at least two of the output nodes of the plurality of mixers are connected to different internal nodes of the filter module.

2. The multi-mixer system of claim 1, wherein the filter module comprises an N-order filter.

3. The multi-mixer system of claim 1, wherein the filter module comprises filters connected in cascade, and the at least two of the output nodes of the plurality of mixers are connected to input nodes of at least two of the filters, respectively.

4. The multi-mixer system of claim 3, wherein at least a portion of the filters are resistor-capacitor (RC) filters.

5. The multi-mixer system of claim 3, wherein at least a portion of the filters are tunable filters.

6. The multi-mixer system of claim 3, wherein the filters are low-pass filters, band-pass filters, or high-pass filters, or a combination thereof.

7. A multi-mixer system, comprising:
a plurality of mixers, wherein each of the plurality mixers is selectively enabled based on a characteristic of an input signal of the plurality of mixers to mix the input signal with a corresponding oscillation signal, wherein the plurality of mixers generate output signals at output nodes of the plurality of mixers; and
a filter module, for providing different frequency responses for the output signals from at least two of the output nodes of the plurality of mixers, wherein the at least two of the output nodes of the plurality of mixers are connected to different internal nodes of the filter module, wherein the plurality of mixers comprises a first group and a second group, the first group comprises at least one of the plurality of mixers whose output node is connected to one internal node of the filter module, and the second group comprises two or more of the plurality of mixers whose output nodes are all connected to another internal node of the filter module.

8. The multi-mixer system of claim 7, wherein the filter module comprises filters connected in cascade, and the output nodes of the plurality of mixers within the first group and the second group are connected to input nodes of two of the filters, respectively.

9. The multi-mixer system of claim 7, wherein the at least one of the plurality of mixers within the first group is arranged to mix the first input signal with the corresponding oscillation signal, and the two or more of the plurality of mixers within the second group are arranged to mix the first input signal and the second input signal with the corresponding oscillation signals, respectively, and the first input signal and the second input signal belong to different standards.

10. A receiver, comprising:
a plurality of mixers including a first mixer and a second mixer, wherein the first mixer is enabled based on a first characteristic of a first input signal to the plurality of mixers and the second mixer is enabled based on a second characteristic of a second input signal to the plurality of mixers, wherein the plurality of mixers mix the first and second input signals with a corresponding oscillation signal to generate output signals at output nodes of the plurality of mixers; and
a filter module, for providing different frequency responses for the output signals from at least two of the output nodes of the plurality of mixers, wherein the at least two of the output nodes of the plurality of mixers are connected to different internal nodes of the filter module.

11. A signal processing method of a multi-mixer system, comprising:
enabling a first mixer based on a first characteristic of a first input signal to the multi-mixer system;
enabling a second mixer based on a second characteristic of a second input signal to the multi-mixer system;
mixing the first input signal with a first oscillation signal to generate a first output signal;
forwarding the first output signal to an internal node of a filter module to make the filter module provide a first frequency response for the first output signal;
mixing the second input signal with a second oscillation signal to generate a second output signal; and forwarding the second output signal to another internal node of the filter module to make the filter module provide a second frequency response for the second output signal.

12. The signal processing method of claim 11, wherein the filter module is an N-order filter.

13. The signal processing method of claim 11, wherein the filter module comprises a plurality of filters connected in cascade, and the first output signal and the second output signal are forwarded to input nodes of two of the filters, respectively.

14. The signal processing method of claim 13, wherein at least a portion of the filters are resistor-capacitor (RC) filters.

15. The signal processing method of claim 13, wherein at least a portion of the filters are tunable filters.

16. The signal processing method of claim 13, wherein the filters are low-pass filters, band-pass filters, or high-pass filters, or their combination.

17. The signal processing method of claim 11, wherein the first input signal and the second input signal belong to a same standard.

18. The signal processing method of claim 11, wherein the first input signal and the second input signal belong to different standards.

19. A multi-mixer system, comprising:
a first mixer, wherein the first mixer is selectively enabled to mix a first input signal to the multi-mixer system with a first oscillation signal having a first frequency to generate a first output signal at a first output node, wherein the first mixer is enabled based on a first characteristic of the first input signal;
a second mixer, wherein the second mixer is selectively enabled to mix a second input signal to the multi-mixer system with a second oscillation signal having a second frequency different from the first frequency, to generate a second output signal at a second output node, wherein the second mixer is enabled based on a second characteristic of the second input signal; and
a filter module, for providing different frequency responses for the first and second output signals from the first and second output nodes of the first and second mixers, wherein the first and second output nodes of the first and second mixers are connected to different internal nodes of the filter module.

20. A multi-mixer system, comprising:
a plurality of mixers, wherein each of the plurality mixers is selectively enabled based on a characteristic of an input signal of the plurality of mixers to mix the input signal with a corresponding oscillation signal, wherein the plurality of mixers generate output signals at output nodes of the plurality of mixers; and
a filter module, for providing different frequency responses for the output signals from at least two of the output nodes of the plurality of mixers, wherein the at least two of the output nodes of the plurality of mixers are connected to different internal nodes of the filter module, wherein filter module comprises:
a first filter connected to a first output node of the at least two output nodes of the plurality of mixers; and
a second filter connected to a second output node the at least two output nodes of the plurality of mixers,
wherein the first filter and second filter are connected in a cascaded configuration.

* * * * *

UNITED STATES PATENT AND TRADEMARK OFFICE
CERTIFICATE OF CORRECTION

PATENT NO. : 9,847,754 B2  
APPLICATION NO. : 15/180068  
DATED : December 19, 2017  
INVENTOR(S) : Kun-Da Chu et al.

Page 1 of 1

It is certified that error appears in the above-identified patent and that said Letters Patent is hereby corrected as shown below:

On the Title Page

Item (73), Assignee should be listed as follows:  
(73) Assignee: MediaTek Inc., Hsin-Chu (TW)

Signed and Sealed this  
Fourteenth Day of August, 2018

Andrei Iancu  
*Director of the United States Patent and Trademark Office*